US008625728B1

(12) United States Patent
Roo

(10) Patent No.: US 8,625,728 B1
(45) Date of Patent: *Jan. 7, 2014

(54) SYSTEM AND METHOD FOR REDUCING ELECTROMAGNETIC INTERFERENCE AND GROUND BOUNCE IN AN INFORMATION COMMUNICATION SYSTEM BY CONTROLLING PHASE OF CLOCK SIGNALS AMONG A PLURALITY OF INFORMATION COMMUNICATION DEVICES

(75) Inventor: Pierte Roo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 67 days.

This patent is subject to a terminal disclaimer.

(21) Appl. No.: 13/460,156

(22) Filed: Apr. 30, 2012

Related U.S. Application Data

(63) Continuation of application No. 13/042,344, filed on Mar. 7, 2011, now Pat. No. 8,170,167, which is a continuation of application No. 10/790,689, filed on Mar. 3, 2004, now Pat. No. 7,903,777.

(51) Int. Cl.
*H04L 7/00* (2006.01)

(52) U.S. Cl.
USPC ........... 375/356; 375/373; 375/354; 375/343; 375/362; 375/376; 326/79; 326/93; 326/21

(58) Field of Classification Search
USPC ................. 375/373, 354, 343, 356, 362, 376; 326/79, 93, 21
See application file for complete search history.

(56) References Cited

U.S. PATENT DOCUMENTS

| 4,818,839 | A  | 4/1989  | Chastain      |
| 5,346,100 | A  | 9/1994  | Lay           |
| 5,399,996 | A  | 3/1995  | Yates et al.  |
| 5,598,406 | A  | 1/1997  | Albrecht et al. |
| 5,610,911 | A  | 3/1997  | Ishikawa et al. |
| 5,686,845 | A  | 11/1997 | Erdal et al.  |
| 5,818,839 | A  | 10/1998 | Sterne et al. |
| 6,046,607 | A  | 4/2000  | Kohdaka       |
| 6,259,745 | B1 | 7/2001  | Chan          |
| 6,305,001 | B1 | 10/2001 | Graef         |
| 6,346,100 | B1 | 2/2002  | Tano et al.   |

(Continued)

FOREIGN PATENT DOCUMENTS

EP    00 903660    3/1999

OTHER PUBLICATIONS

Ashok Vittal, Hien Ha, Forrest Brewer and Malgorzata Marek-Sadowska, "Clock skew optimization for ground bounce control", IEEE 1063-6757/96, dated 1996.

*Primary Examiner* — Siu Lee

(57) ABSTRACT

A communication system including a phase-locked loop, a signal division controller, a divider, and a transmitter. The phase-locked loop is configured to generate an output signal in response to a common reference clock signal. The output signal is in phase lock with the common reference clock signal. The signal division controller is configured to receive a select signal, select an edge of a rising edge of the output signal and a falling edge of the output signal in response to the select signal, and generate a divider reset signal in response to the selected edge. The divider is configured to generate a communication clock signal by performing frequency division of the output signal. The divider reset signal controls a start time of the frequency division. The transmitter is configured to operate in response to the communication clock signal.

20 Claims, 15 Drawing Sheets

(56) References Cited

U.S. PATENT DOCUMENTS

| | | |
|---|---|---|
| 6,459,746 B2 | 10/2002 | Agazzi et al. |
| 6,477,200 B1 | 11/2002 | Agazzi et al. |
| 6,487,648 B1 | 11/2002 | Hassoun |
| 6,717,997 B1 | 4/2004 | Cranford et al. |
| 6,946,870 B1 | 9/2005 | Lesea |
| 7,290,162 B2 | 10/2007 | Swarbrick et al. |
| 2003/0006851 A1 | 1/2003 | Wood |
| 2003/0197498 A1 | 10/2003 | Watanabe et al. |
| 2004/0043734 A1 | 3/2004 | Hashidate |
| 2005/0135299 A1 | 6/2005 | Bishop et al. |

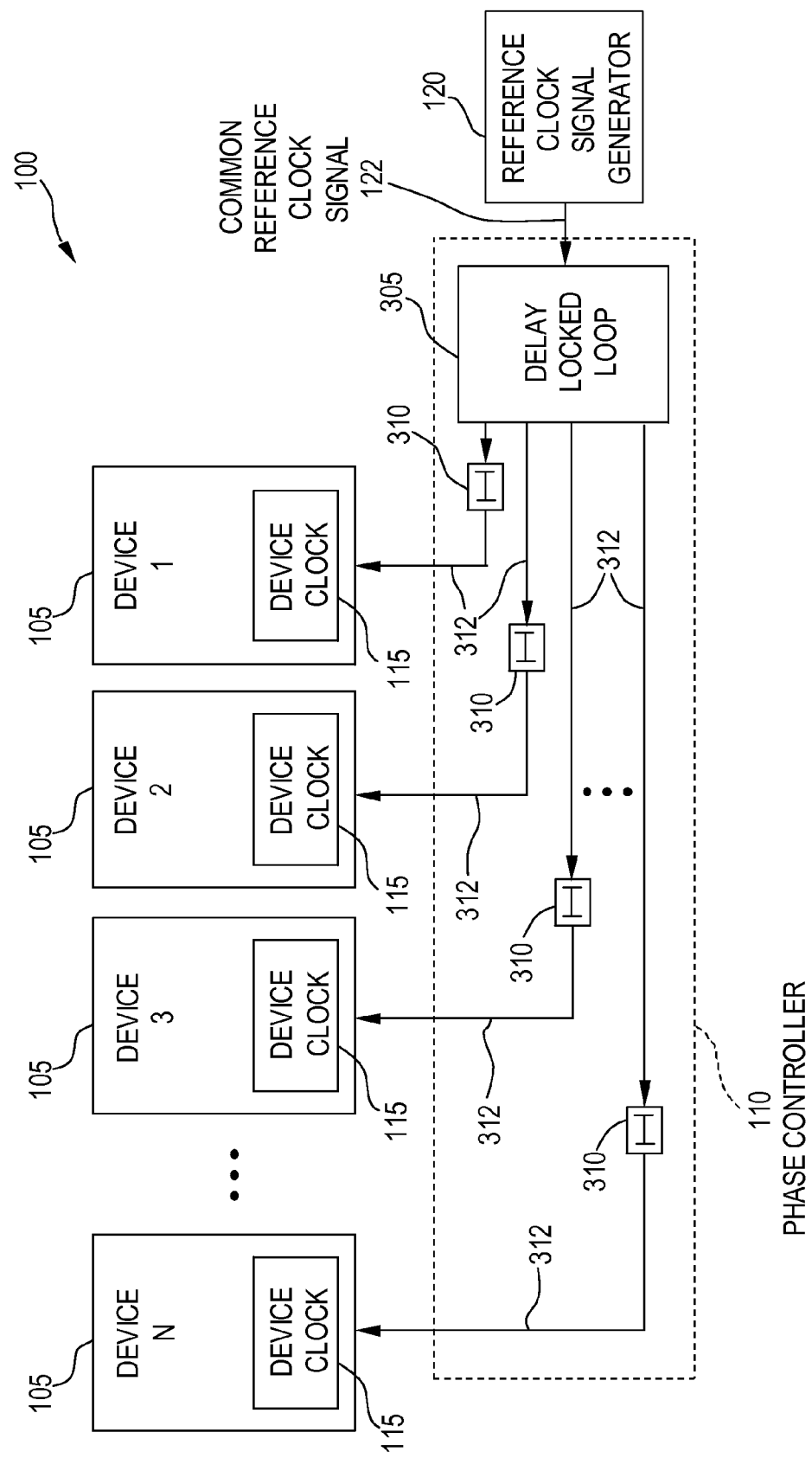

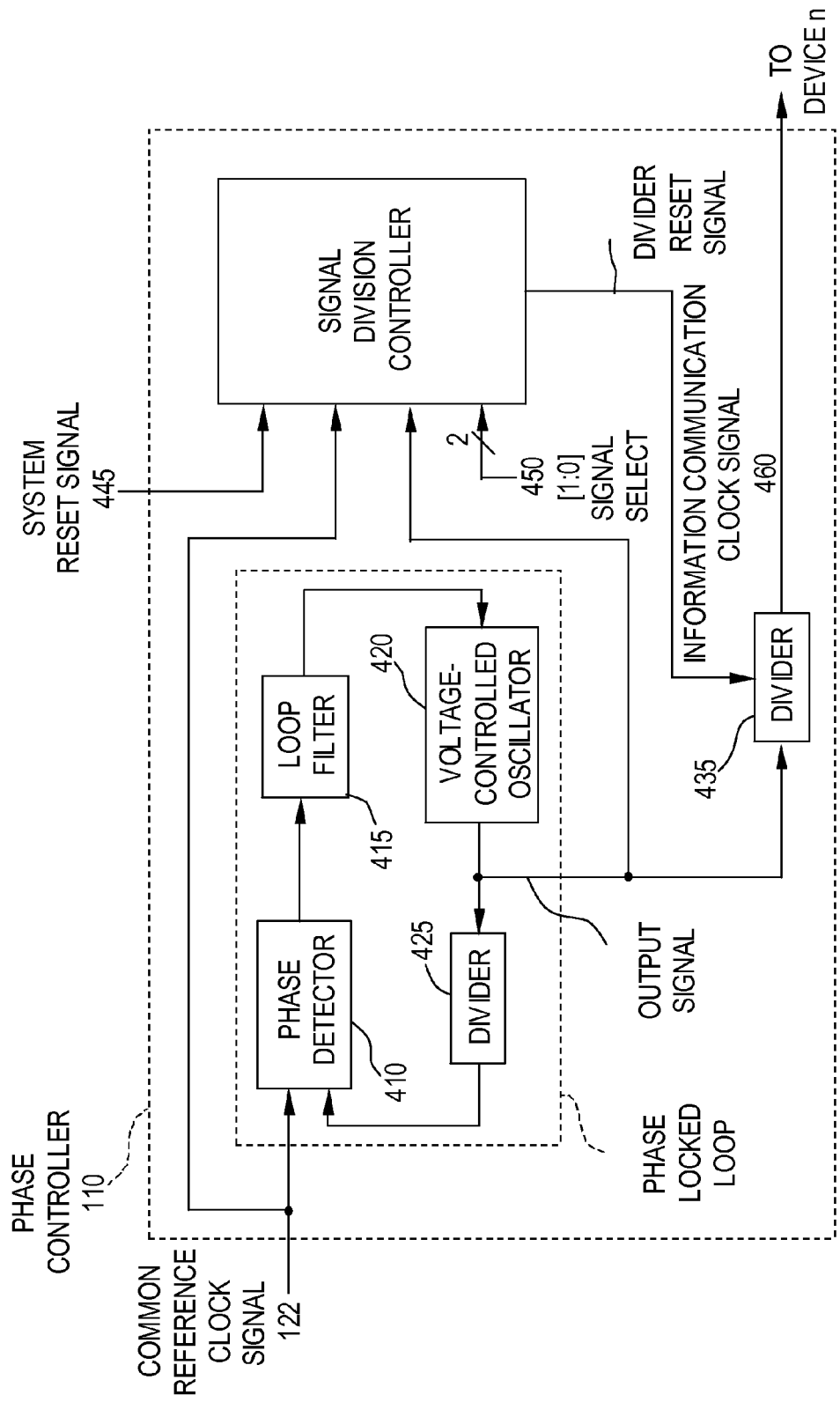

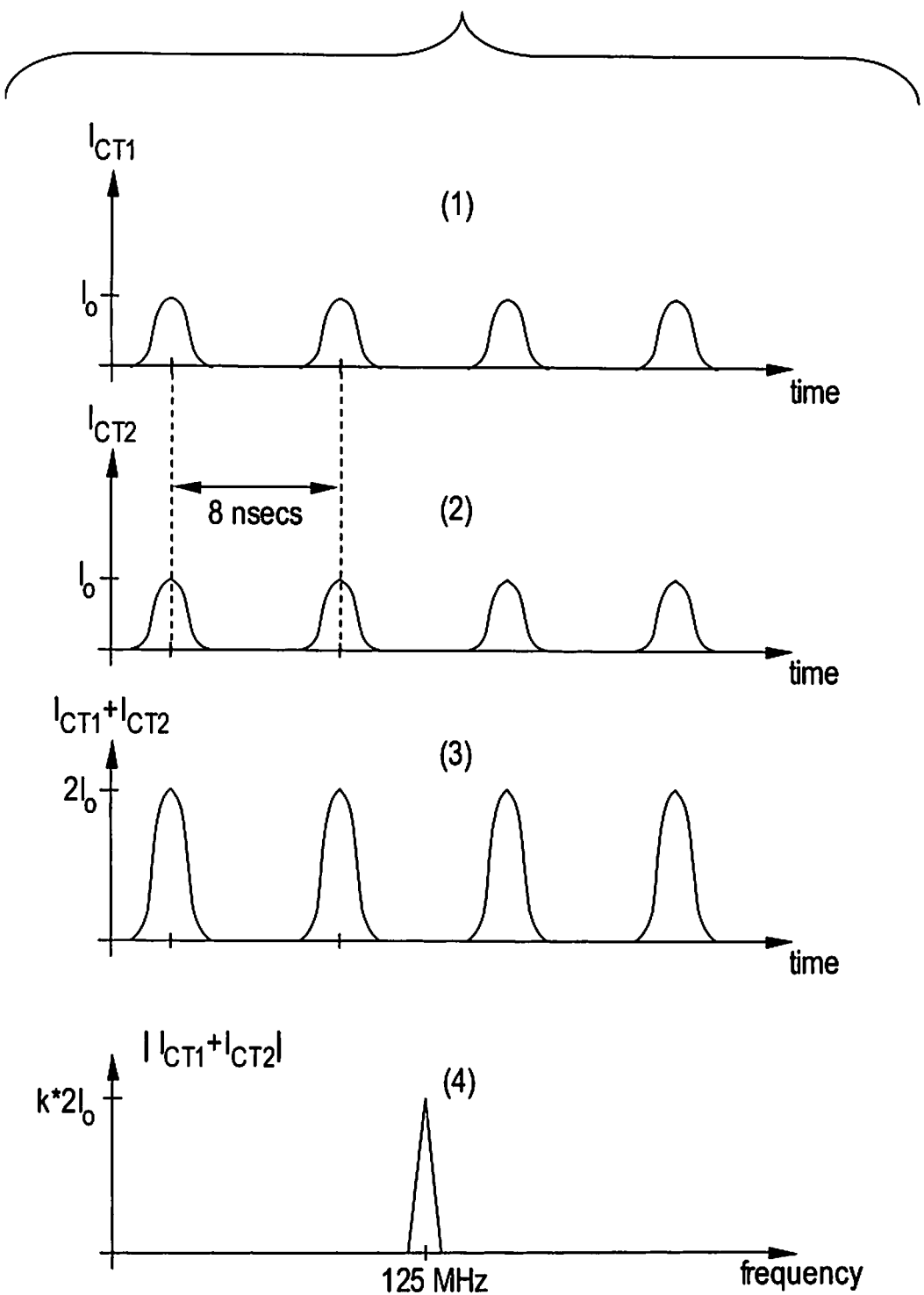

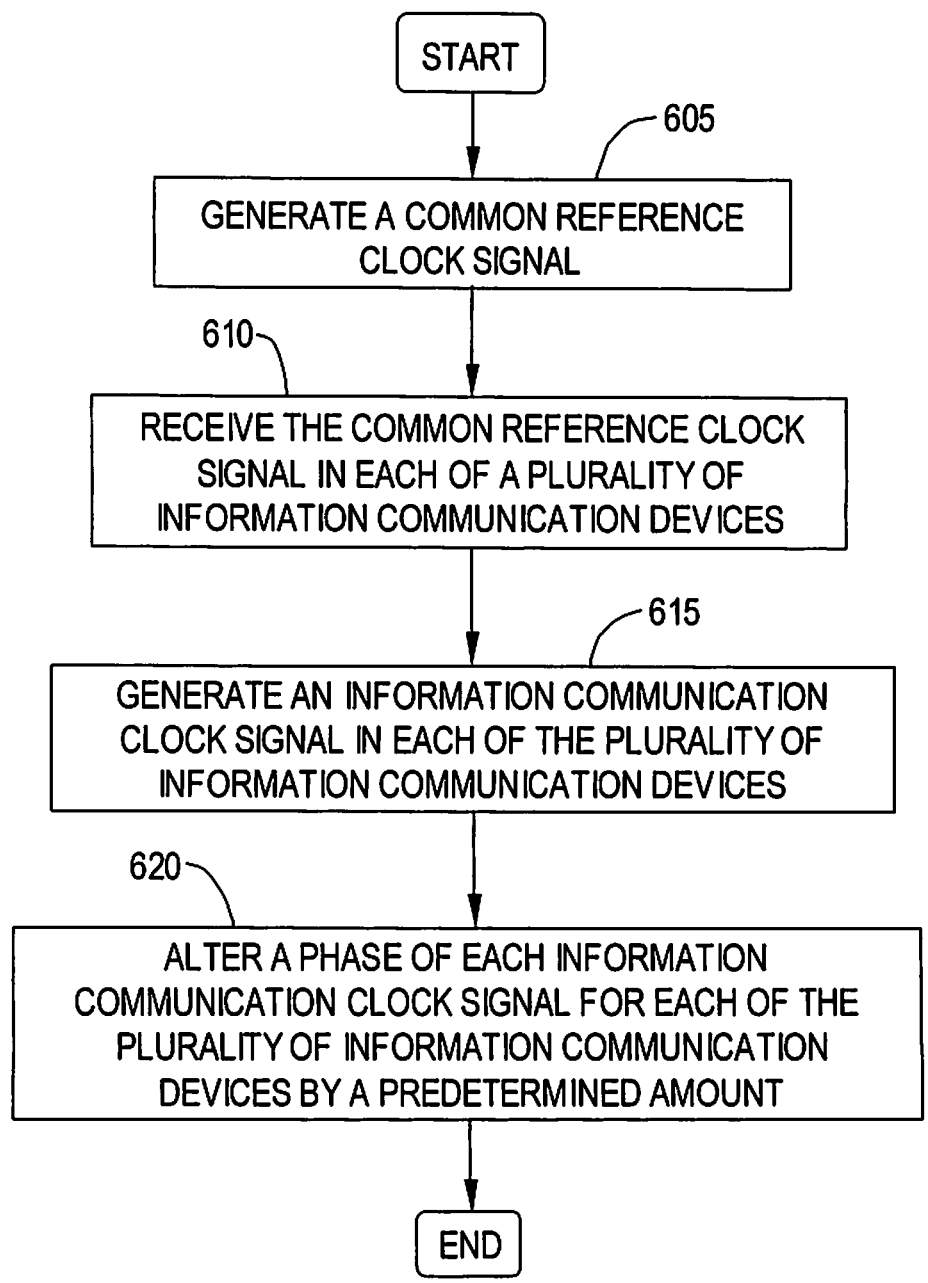

SYSTEM AND METHOD FOR REDUCING ELECTROMAGNETIC INTERFERENCE AND GROUND BOUNCE IN AN INFORMATION COMMUNICATION SYSTEM BY CONTROLLING PHASE OF CLOCK SIGNALS AMONG A PLURALITY OF INFORMATION COMMUNICATION DEVICES

CROSS-REFERENCE TO RELATED APPLICATION

This application is a continuation of U.S. patent application Ser. No. 13/042,344, filed on Mar. 7, 2011 (now U.S. Pat. No. 8,170,167), which is a continuation of U.S. patent application Ser. No. 10/790,689 filed on Mar. 3, 2004 (now U.S. Pat. No. 7,903,777). The entire disclosures of the above applications are incorporated herein by reference.

BACKGROUND

The present invention relates to noise and interference reduction in information communication systems. More particularly, the present invention relates to a system and method for reducing electromagnetic interference and ground bounce in an information communication system by controlling the phase of clock signals among a plurality of information communication devices of the information communication system.

A gigabit transceiver chip can, for example, transmit information from several ports simultaneously. Such simultaneous transmission can lead to a condition known as "ground bounce" that can cause unwanted transients in the supply voltage and current on the chip. Ground bounce is a voltage oscillation between the ground pin on a component package and the ground reference level on the component die. Ground bounce is essentially caused by a current surge passing through the lead inductance of the package. More particularly, the output voltage of an IC package can be referenced to the ground on the chip. The bond wire connection between the chip and the lead frame of the package contributes a small amount of inductance in the circuit. When the output voltage goes low, a spike of current flows through this inductance and creates a voltage spike at the ground on the chip. A device connected to the output of the circuit will see a logical low that is the specified low for the device plus the voltage spike across the inductance of the lead frames. This effect is the ground bounce.

The effect is most pronounced when all outputs switch simultaneously. Consequently, ground bounce is sometimes referred to as "simultaneous switching noise." While the inductance is the combined effect of the package lead, the package lead frame, the bond wire and the inductance in the die pad, a majority of the inductance is caused by the bond wire. Ground bounce can cause, for example, signal degradation in the output waveform of the device.

For example, in a gigabit transceiver chip, each port can derive its port clock from a common reference clock. Transitions in each port clock can cause a small ground bounce. When all of the port clocks are aligned (i.e., all of the port clocks are in phase), the small ground bounce caused by each port clock can aggregate to produce a large ground bounce. Similarly, each transmitter of the network switch chip can derive its transmitter clock from a common system transmitter clock. Each transmitter clock can generate a tone of electromagnetic interference (EMI) at the transmit frequency. When all of the transmitter clocks are aligned (i.e., all of the transmitter clocks are in phase), the EMI produced by each transmitter clock can aggregate to produce an amplified tone of EMI. Thus, clock alignment can cause increased ground bounce and EMI in, for example, the gigabit transceiver chip.

SUMMARY

A system and method are disclosed for reducing electromagnetic interference and ground bounce in an information communication system by controlling the phase of clock signals among a plurality of information communication devices of the information communication system. In accordance with exemplary embodiments of the present invention, according to a first aspect, an information communication system can include a plurality of information communication devices. Each of the plurality of information communication devices can be responsive to a respective information communication clock signal. Each information communication clock signal of each of the plurality of information communication devices can be associated with a common reference clock signal. The information communication system can include a phase controller. The phase controller can be responsive to the common reference clock signal. The phase controller can alter a phase of each information communication clock signal of each of the plurality of information communication devices by a predetermined amount.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 3 is a block diagram illustrating a system for controlling phase of clock signals among a plurality of information communication devices of an information communication system using a phase controller comprised of a plurality of time-delayed communication channels, in accordance with an alternative exemplary embodiment of the present invention.

FIG. 4 is a block diagram illustrating a system for controlling phase of clock signals among a plurality of information communication devices of an information communication system using a phase controller comprised of a phase locked loop, in accordance with an alternative exemplary embodiment of the present invention.

FIGS. 5A and 5B are graphs illustrating how electromagnetic interference can be mitigated, in accordance with an exemplary embodiment of the present invention.

FIG. 6 is a flowchart illustrating steps for controlling phase of clock signals among a plurality of information communication devices of an information communication system, in accordance with an exemplary embodiment of the present invention.

DETAILED DESCRIPTION

A system and method are disclosed for reducing electromagnetic interference and ground bounce in an information communication system by controlling the phase of clock signals among a plurality of information communication devices of the information communication system. The information communication system, such as, for example, a multi-port transceiver or network device compliant with I.E.E.E. 802.3ab, can communicate information on several ports simultaneously. Such simultaneous communication can lead to "ground bounce," causing unwanted transients in the supply voltage and current in the information communication system. For example, each port of the information communication system can derive its port clock from a common reference clock. Transitions in each port clock can cause a small ground bounce. When all of the port clocks are aligned (i.e., all of the port clocks are in phase), the small ground bounces contributed by each port clock can aggregate to produce a large ground bounce. According to exemplary embodiments of the present invention, the phase of each port clock can be staggered in a deterministic manner relative to all other port clocks so that the port clocks are not aligned (i.e., not in phase). For example, the phase of each port clock can be staggered by 45 or 90 degrees using, for example, a clock divider and combinatorial logic. By staggering the phase of each of the port clocks relative to one another, the small ground bounces contributed by each port clock do not aggregate, thereby reducing the effects of ground bounce in the information communication system.

According to an alternative exemplary embodiment, the information communication system can include a plurality of, for example, transmitters. Each transmitter of the information communication system can derive its transmitter clock from a common system transmitter clock. Each transmitter clock can generate a tone of electromagnetic interference (EMI) at the transmit frequency. When all of the transmitter clocks are aligned (i.e., all of the transmitter clocks are in phase), the EMI contributed by each transmitter clock can aggregate to produce an amplified tone of EMI. According to exemplary embodiments of the present invention, the phase of each transmitter clock can be staggered in a deterministic manner relative to all other transmitter clocks, such as, for example, by 45 or 90 degrees. By staggering the phase of each of the transmitter clocks relative to one another, the amplitude of the EMI can be decreased, while the frequency of the EMI can be increased, thereby helping to mitigate the EMI of the information communication system.

Figure 1:
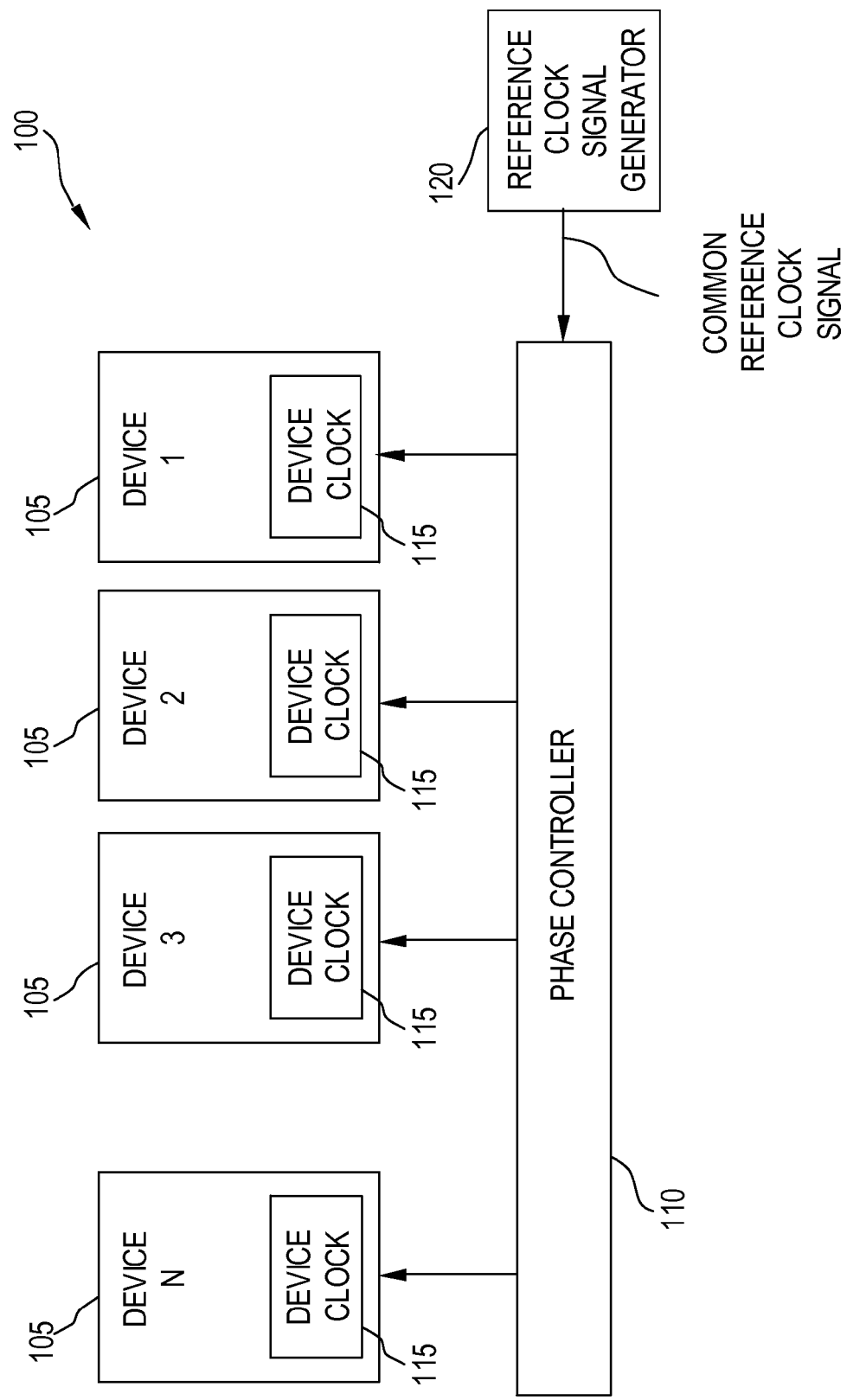
FIG. 1 is a block diagram illustrating a system for controlling phase of clock signals among a plurality of information communication devices of an information communication system, in accordance with an exemplary embodiment of the present invention.

These and other aspects of the present invention will now be described in greater detail. FIG. 1 is a block diagram illustrating a system for controlling phase of clock signals among a plurality of information communication devices of an information communication system 100, in accordance with an exemplary embodiment of the present invention. Information communication system 100 includes a plurality of information communication devices 105. Information communication system 100 can be comprised of any number N of information communication devices. Each of the plurality of information communication devices 105 is responsive to a respective information communication clock signal. Each information communication clock signal of each of the plurality of information communication devices 105 is associated with a common reference clock signal 122. In other words, each information communication clock signal can be derived, either directly or indirectly, from a common reference clock signal 122 or several of such reference clock signals (e.g., where the number of common reference clock signals 122 is less than the number of information communication devices 105).

The information communication system 100 includes a phase controller 110. A single phase controller 110 can be in communication with each of the plurality of information communication devices 105. Alternatively, each of or groups of the plurality of information communication devices 105 can be in communication with a separate phase controller 110. The phase controller 110 is responsive to the common reference clock signal 122. For example, the common reference clock signal 122 can be generated by a reference clock signal generator 120.

According to exemplary embodiments, phase controller 110 alters the phase of each information communication clock signal of each of the plurality of information communication devices 105 by a predetermined amount. In other words, phase controller 110 can stagger the phase of each information communication clock signal of each of the plurality of information communication devices 105 relative to each other. The predetermined amount can be any suitable change in phase in each of the information communication clock signals relative to the other information communication clock signals. According to one exemplary embodiment of the present invention, phase controller 110 alters the phase of each information communication clock signal of each of the plurality of information communication devices 105 by a multiple of 90 degrees. For example, if there are four information communication devices 105, then the corresponding four information communication clock signals can each be staggered in phase by 90 degrees relative to each other by phase controller 110 according to, for example, (0°, 90°, 180°, 270°), (0°, 180°, 270°, 90°), or any other suitable combination of phases such that the phases of the individual information communication clock signals are not aligned. For example, if there are eight information communication devices 105, then the corresponding eight communication clock signals can each be staggered in phase by 45 degrees relative to each other by phase controller 110 according to, for example, (0°, 45°, 90°, 135°, 180°, 225°, 270°, 315°) or any other suitable combination of phases.

Alternatively, the phase controller 110 alters the phase of the information communication clock signals such that the phase of two or more of the information communication clock signals are substantially identical, so long as the number of information communication clock signals with substantially identical phase is less than the total number of information communication clock signals of the information communication system 100. For the example of eight information communication devices 105, the corresponding eight communication clock signals can each be staggered in phase by 90 degrees relative to each other by phase controller 110 according to, for example, (0°, 90°, 180°, 270°, 0°, 90°, 180°, 270°) or any other suitable combination of phase such that the phases of less than all of information communication clock signals are not aligned. However, according to exemplary embodiments, phase controller 110 can alter the phase of each of the information communication clock signals relative to each other by any appropriate amount.

According to exemplary embodiments, each of the plurality of information communication devices 105 is responsive to the common reference clock signal 122 altered by phase controller 110. For example, each of the plurality of information communication devices includes a device clock 115 for generating the respective information communication clock signal from the common reference clock signal 122 altered by phase controller 110. According to an exemplary embodiment, the device clock 115 of each of the plurality of information communication devices 105 derives the respective information communication clock signal from the common reference clock signal 122. Thus, to alter the phase of each information communication clock signal of each of the plurality of information communication devices 105 by the predetermined amount, phase controller 110 alters the phase of the common reference clock signal 122 for each of the plurality of information communication devices 105 by the predetermined amount. In other words, by staggering the phase of the common reference clock signal 122 for each of the information communication devices 105, phase controller 110 can stagger the phases of the information communication clock signals relative to each other.

Figure 2:
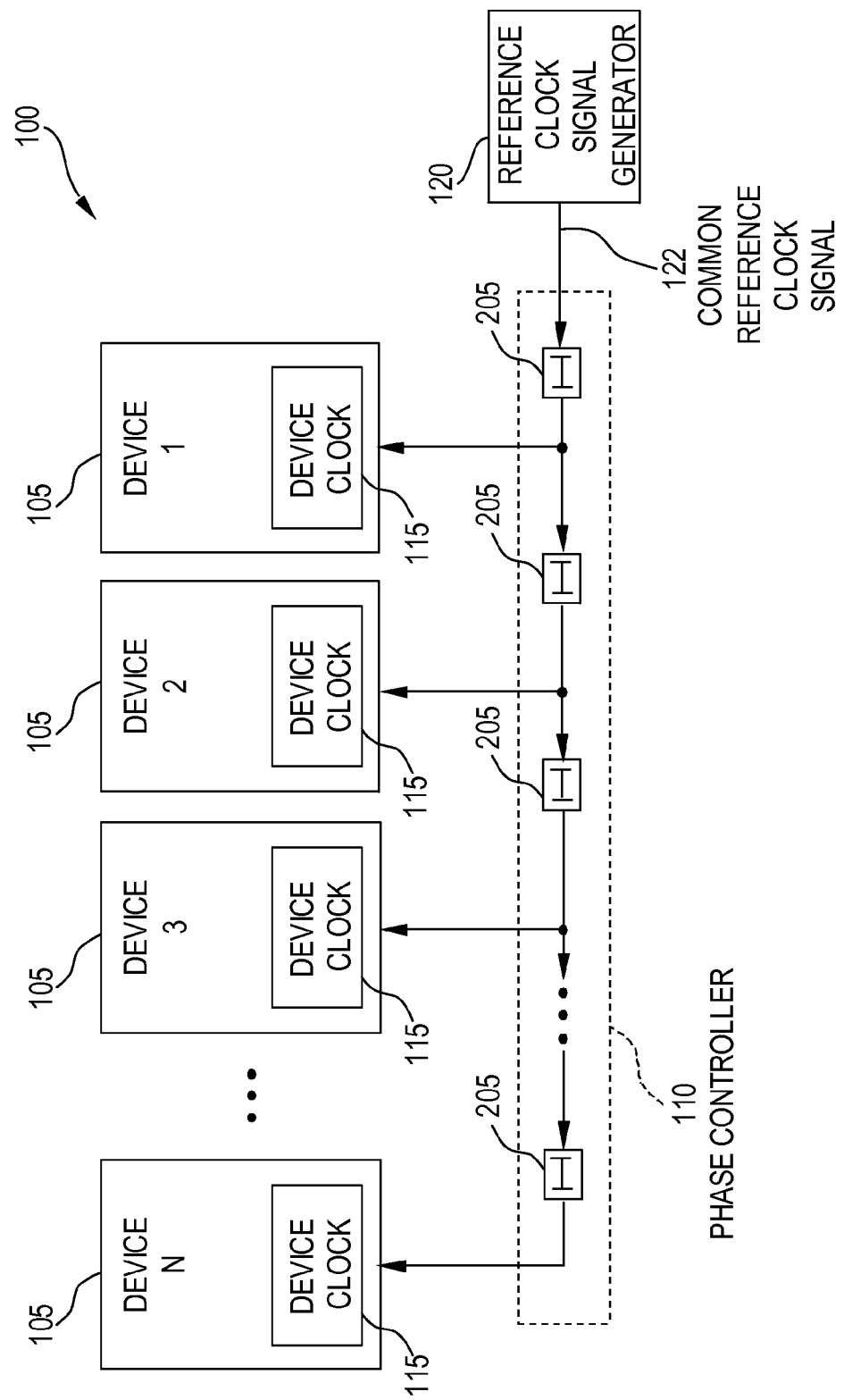
FIG. 2 is a block diagram illustrating a system for controlling phase of clock signals among a plurality of information communication devices of an information communication system using a plurality of time delay elements, in accordance with an exemplary embodiment of the present invention.

For example, phase controller 110 can include a plurality of time delay elements. FIG. 2 is a block diagram illustrating a system for controlling phase of clock signals among a plurality of information communication devices 105 of an information communication system 100 using a plurality of time delay elements 205, in accordance with an exemplary embodiment of the present invention. As illustrated in FIG. 2, the plurality of time delay elements 205 are cascaded or otherwise arranged in serial communication with each other to provide varying time delays of the common reference clock signal 122.

According to exemplary embodiments, each of the plurality of information communication devices 105 can be in communication with at least one of the plurality of time delay elements 205. The time delay introduced by each of the time delay elements 205 is cumulative as the common reference clock signal 122 is propagated along the chain of time delay elements 205. Consequently, the phase of the common reference clock signal 122 can be altered for each of the information communication devices 105 by delaying the common reference clock signal 122 by the desired amount using an appropriate number of time delay elements 205. For example, each time delay element 205 introduces a time delay of $t_d$ seconds (where $t_d$ can be any appropriate length of time delay), although each of the time delay elements can introduce the same or different amounts of time delay. For the exemplary embodiment illustrated in FIG. 2, the common reference clock signal 122 is delayed by $t_d$ seconds into information communication device 1, by $2^*t_d$ seconds into information communication device 2, by $3^*t_d$ seconds into information communication device 3, and by $N^*t_d$ seconds into information communication device N.

In the exemplary embodiment illustrated in FIG. 2, the time delay of the common reference clock signal 122 into each of the plurality of information communication devices 105 is based on the cumulative effect of the cascaded or otherwise serially-arranged time delay elements 205. However, each of the time delay elements 205 can be affected by slight variations in voltage, process, temperature and the like, which alters the length of time delay introduced by each of the time delay elements 205. To address this condition, an alternative structure can be used for phase controller 110.

FIG. 3 is a block diagram illustrating a system for controlling phase of clock signals among a plurality of information communication devices 105 of an information communication system 100 using a phase controller 110 comprised of a plurality of time-delayed communication channels, in accordance with an alternative exemplary embodiment of the present invention. According to the alternative exemplary embodiment, the phase controller 110 includes at least one delay locked loop 305. The at least one delay locked loop 305 is in communication with each of the plurality of information communication devices 105 via an information communication channel 312. For example, the delay locked loop 305 can be in communication with each of the plurality of information communication devices 105 using a separate information communication channel 312, or an information communication channel 312 can be in communication with groups of information communication devices 105. To control the amount of time delay of the common reference clock signal 122 into each of the plurality of information communication devices 105, each information communication channel 312 includes at least one of the plurality of time delay elements 310. The amount of time delay introduced through each information communication channel 312 is altered by, for example, changing the number of time delay elements 310 located along an information communication channel 312, changing the amount of time delay supplied by the one or more time delay elements 310 in the information communication channel 312, and the like. The embodiment illustrated in FIG. 3 can also be used to address issues related to clock skew.

According to an exemplary embodiment, phase controller 110 alters the phase of each information communication clock signal of each of the plurality of information communication devices 105 by, for example, altering the phase of the common reference clock signal 122 supplied to each of the information communication devices 105 from which each information communication clock signal can be generated. Alternatively, the phase of each information communication clock signal can be directly altered by the phase controller 110.

FIG. 4 is a block diagram illustrating a system for controlling phase of clock signals among a plurality of information communication devices of an information communication system using a phase controller comprised of a phase locked loop, in accordance with an alternative exemplary embodiment of the present invention. Phase controller 110 includes a phase locked loop 405 that is configured to receive the common reference clock signal 122. For example, phase locked loop 405 includes a phase detector 410, a loop filter 415, a voltage-controlled oscillator 420 and a divider 425. Phase locked loop 405 produces an output signal 440 at any appropriate frequency. The output signal 440 is supplied to a divider 435. Divider 435 is configured to perform signal division or decimation on output signal 440 to generate an information communication clock signal 460 of equal or lesser frequency than output signal 440. The output signal 440 is associated with the information communication clock signal 460. In other words, divider 435 divides the frequency of output signal 440 by any appropriate amount to generate the desired frequency of information communication clock signal 460. For purposes of illustration and not limitation, if the frequency of output signal 440 is 500 MHz, and if each of the information communication devices 105 uses a 125 MHz information communication clock signal, then divider 435 divides output signal 440 by a factor of four to generate an information communication clock signal 460 of 125 MHz. Other frequencies and division ratios can also be used.

To control the phase of each information communication clock signal 460 relative to the other information communication clock signals 460, the phase controller 110 includes a signal division controller 430. Signal division controller 430 is configured to control the start time of signal division performed by divider 435 on the output signal 440 of phase locked loop 405. In other words, signal division controller 430 varies the start time of signal division of the output signal 440 performed by divider 435 to alter the phase of each information communication clock signal 460 generated for each of the plurality of information communication devices 105. For example, signal division controller 430 can be comprised of combinatorial logic that is responsive to the common reference clock signal 122, as well as the output signal 440. Signal division controller 430 can also be responsive to a system reset signal 445 that can be from, for example, a power management system associated with information communication system 100. For example, when an information communication device(s) 105 is (are) powered up or otherwise activated, the system reset signal 445 can be used as notification to begin controlling signal division to create information communication clock signal(s) 460 for the powered-up device(s). As the system reset signal 445 may not be synchronous with common reference clock signal 122 and/or output signal 440, system reset signal 445 can be gated so that it is synchronous with common reference clock signal 122 and/or output signal 440.

Signal division controller 430 can also be responsive to a signal select 450. Signal select 450 can be used to select the phase of the information communication signal 460 to be generated. For purposes of illustration and not limitation, if there are four information communication devices 105, each information communication device 105 can be assigned one of four unique phases.

Thus, a two-bit selection signal can be used for signal select 450 to choose one of the four phases for information communication clock signal 460. In other words, for a chosen information communication clock signal 460, signal division controller 430 generates a divider reset signal 455 that resets divider 435 so that division of output signal 440 is begun at the proper time. By beginning division of output signal 440 at different times (e.g., at different rising edges and/or falling edges of output signal 440), the phase of the information communication clock signal 460 is varied. The number of bits used for signal select 450 will depend on, for example, the number of information communication clock signals 460 to be generated, the total number of phase values from which an information communication clock signal 460 can be selected, and the like. For example, a three-bit selection signal can be used to select one of eight possible phase values. Other bit widths of signal select 450 are possible.

According to an exemplary embodiment, a single phase controller 110 can be used to generate information communication clock signals 460 for all of the plurality of information communication devices 105. Alternatively, two or more phase controllers 110 can be used to generate information communication clock signals 460 for different groups of information communication devices 105, or each information communication device 105 can have a separate phase controller 110. However, according to each of these exemplary embodiments, the signal division controller(s) 430 generates the divider reset signal 455 at the proper time to alter the phase of each information communication clock signal of each of the plurality of information communication devices 105 by a predetermined amount relative to one or more other information communication clock signals.

For purposes of illustration and not limitation, according to one exemplary embodiment of the present invention, the information communication system 100 can comprise a multi-port transceiver or network device compliant with, for example, I.E.E.E. 802.3ab. For example, the information communication devices 105 can be the ports of the multi-port transceiver or network device. For example, the information communication devices 105 can be the individual transmitters of the multi-port transceiver or network device, such as, for example, individual class B transmitters. The multi-port network device compliant with I.E.E.E. 802.3ab can be comprised of a plurality of transceivers, where the plurality can be, for example, four or eight or any other number of transceivers. Alternatively, the information communication system 100 can be an Ethernet transceiver, such as an Ethernet transceiver compliant with, for example, I.E.E.E. 802.3ab. However, information communication system 100 can be any suitable information communication system.

According to exemplary embodiments, any combination or all of the components of information communication system 100 can be formed on a monolithic substrate. For example, the information communication devices 105 of the information communication system 100 can be formed on the monolithic substrate. Alternatively, information communication system 100 can be comprised of discrete components, including any suitable combination of electrical or electronic components or devices comprised of information communication devices 105, in which each information communication clock signal of each of the information communication devices 105 is derived, either directly or indirectly, from a common reference clock signal 122 (or a few such reference signals), thereby creating a phase relationship between the information communication devices 105. According to the alternative exemplary embodiment, each of the information communication devices 105 can be any suitable type of electrical or electronic component or device capable of using an information communication clock signal to communicate information, such as, for example, a transceiver compliant with I.E.E.E. 802.3ab, a transmitter, a receiver, or the like, and in which the information communication clock signal can be derived, either directly or indirectly, from the common reference clock signal 122.

According to exemplary embodiments, the information communication clock signal can be any suitable type of clock signal, of any appropriate amplitude, at any suitable frequency that can be used for communicating information. The common reference clock signal 122 can be any suitable reference clock signal, of any appropriate amplitude, at any suitable frequency that can be used to derive, either directly or indirectly, one or more information communication clock signals.

The phase control controller 110 can be formed on the same monolithic as the plurality of information communication devices 105. Alternatively, the phase controller 110 can be a discrete component comprised of any appropriate type of electrical or electronic component or device that is capable of altering the phase of each information communication clock signal of each of the plurality of information communication devices 105, either directly (e.g., by altering the phase of the information communication clock signal itself) or indirectly (e.g., by altering the phase of the common reference clock signal 122 to alter the phase of the information communication clock signal). According to the alternative exemplary embodiment, the phase controller 110 can be in communication with each of the plurality of information communication devices 105 using any appropriate type of electrical connection capable of communicating electrical information.

Reference clock signal generator 120 can be formed on the same monolithic substrate as phase controller 110 and the plurality of information communication devices 105. Alternatively, the reference clock signal generator 120 can be a discrete component comprised of any suitable type of electrical or electronic component or device that is capable of generating a reference clock signal of any appropriate amplitude at any suitable frequency. According to the alternative exemplary embodiment, phase controller 110 can be in communication with reference clock signal generator 120 using any suitable type of electrical connection that is capable of communicating electrical information.

Each device clock 115 can be formed on the same monolithic substrate as phase controller 110, the plurality of information communication devices 105, and the reference clock signal generator 120. Alternatively, each device clock 115 can be a discrete component comprised of any suitable type of electrical or electronic component or device that is capable of generating an information communication clock signal from a common reference clock signal 122. According to the alternatively exemplary embodiment, the device clock 115 can be in communication with the respective information communication device 105 using any suitable type of electrical connection capable of communicating electrical information, or the device clock 115 can form a component internal to the respective information communication device 105.

The plurality of time delay elements 205 that can comprise phase controller 110, as illustrated in FIG. 2, can be formed on the same monolithic substrate as the other elements of information communication system 100. Alternatively, time delay elements 205 can be discrete components comprising any suitable type of electrical or electronic component or device that is capable of delaying an electrical signal in time. According to the alternative exemplary embodiment, the plurality of time delay elements 205 can be in communication with each other using any suitable type of electrical connection capable of communicating electrical information. According to either embodiment, time delay elements 205 can comprise, for example, delay locked loops or the like.

The delay locked loop 305, as illustrated in FIG. 3, can be any suitable type of delay locked loop. The delay locked loop 305, and the associated time delay elements 310, and can be formed on the same monolithic substrate as other elements of information communication system 100. Each information communication channel 312 illustrated in FIG. 3 can be formed on the same monolithic substrate as the other elements of information communication system 100. Alternatively, each information communication channel 312 can be any suitable type of electrical connection capable of communicating electrical information.

The phase locked loop 405, and its associated components, can be formed on a monolithic substrate, such as the same monolithic substrate as other elements of information communication system 100. Alternatively, phase locked loop 405 can be any suitable type of electrical or electronic component or device that is capable of controlling an oscillator so that it maintains a constant phase angle relative to a reference signal, such as, for example, common reference clock signal 122. According to the alternative exemplary embodiment, phase detector 410, loop filter 415, voltage-controlled oscillator 420 and divider 425 can be discrete components, and can be in communication with each other using any appropriate type of electrical connection capable of communicating electrical information.

Divider 435 can be formed on the same monolithic substrate as phase locked loop 405 and the other elements of information communication system 100. Alternatively, divider 435 can be a discrete component in communication with phase locked loop 405 using any suitable type of electrical connection capable of communicating electrical information.

Signal division controller 430 can be formed on the same monolithic substrate as phase locked loop 405, divider 435, and the other elements of information communication system 100. Alternatively, signal division controller 430 can be a discrete component in communication with phase locked loop 405 and divider 435 using any suitable type of electrical connection capable of communicating electrical information.

Those of ordinary skilled will recognize that the information communication system 100 can include any additional electrical or electronic components or devices in any suitable combination that can be used for communicating information signals, depending upon the nature and type of information signals to be communicated and the environment in which the information communication system 100 is to be used. For example, the information communication system 100 can be connected to additional components, such as, for example, any type of processor, including any type of microprocessor, microcontroller, digital signal processor (DSP), application-specific integrated circuit (ASIC), programmable read-only memory (PROM), erasable programmable read-only memory (EPROM), electrically-erasable programmable read-only memory (EEPROM), or the like. For example, the information communication system 100 can also be connected to any type of computer memory or any other type of electronic storage medium that is located either internally or externally to the processor such as, for example, read-only memory (ROM), random access memory (RAM), cache memory, compact disc read-only memory (CDROM), electro-optical memory, magneto-optical memory, or the like. The processor and memory can be used, for example, to perform additional processing on information signals that have been or are to be communicated by information communication system 100, for controlling any part of the information communication system 100, or the like.

Figure 5B:
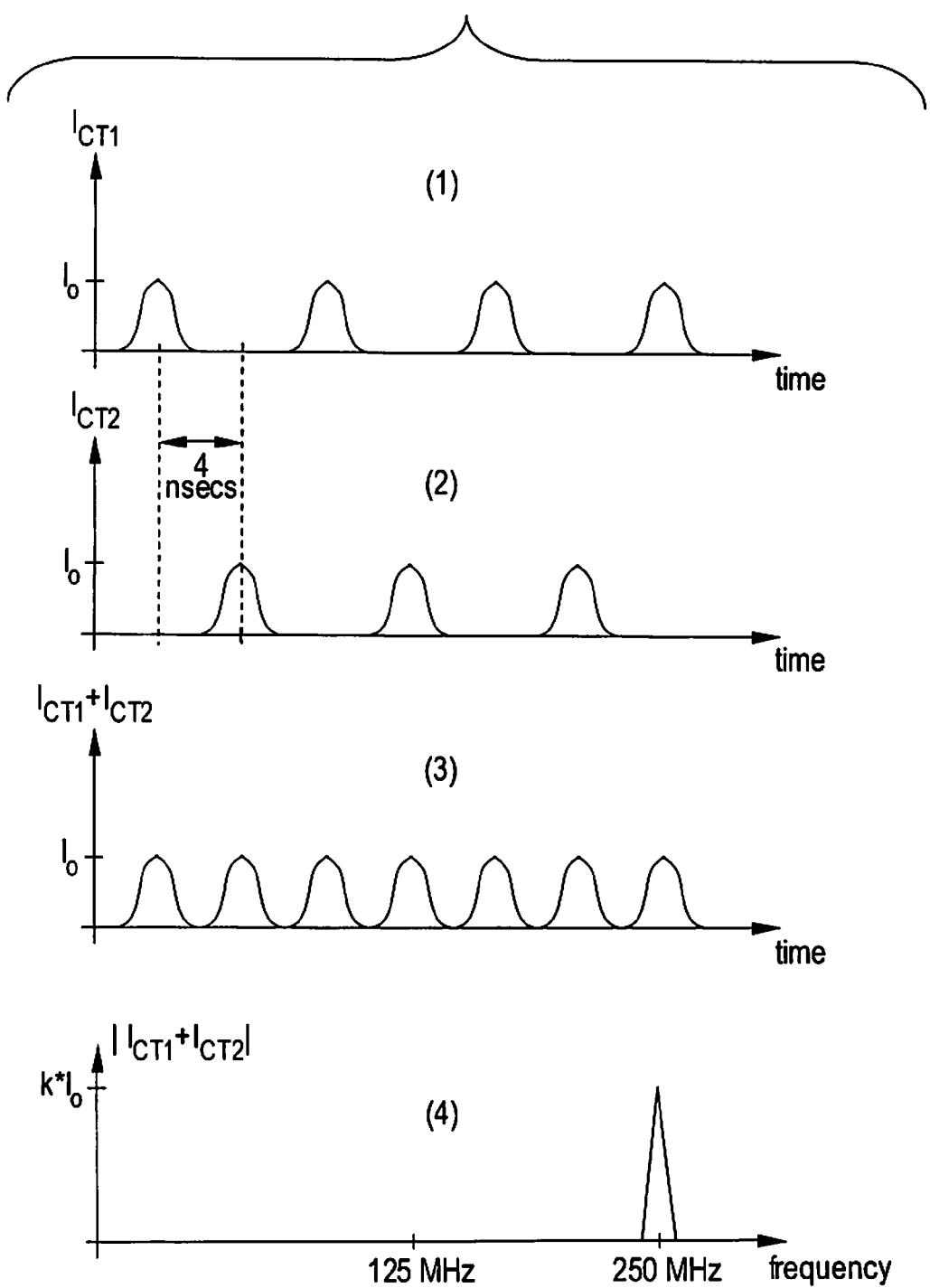

Exemplary embodiments of the present invention can be used to mitigate the effects of ground bounce and EMI in information communication systems. FIGS. 5A and 5B are graphs illustrating how EMI can be mitigated, in accordance with an exemplary embodiment of the present invention. For purposes of illustration and not limitation, the plurality of information communication devices 105 can comprise two transmitters (e.g., two class B transmitters) of the information communication system 100, each using an information communication clock signal of 125 MHz. Each information communication clock signal can be derived from a common reference clock signal. Each transmitter can have a centertapped current into a respective output transformer, $I_{CT1}$ and $I_{CT2}$, respectively. In FIG. 5A, the information communication clock signals for the two transmitters are in phase. Graph (1) of FIG. 5A illustrates the current waveform of $I_{CT1}$, with an amplitude of $I_o$ and a period of 8 nanoseconds, corresponding to a frequency of 125 MHz. Graph (2) of FIG. 5A illustrates the current waveform of $I_{CT2}$, with an amplitude of $I_o$ and a period of 8 nanoseconds, corresponding to a frequency of 125 MHz. As the waveforms of $I_{CT1}$ and $I_{CT2}$ are in phase, the addition of the individual waveforms can result in a combined waveform $I_{CT1}+I_{CT2}$ that is the same frequency, but twice the amplitude, of $I_{CT1}$ and $I_{CT2}$, as shown in Graph (3) of FIG. 5A. Graph (4) of FIG. 5A illustrates the frequency spectrum of the combined waveform $I_{CT1}+I_{CT2}$. As the resulting generated signals of $I_{CT1}$ and $I_{CT2}$ are in phase, an EMI frequency component can be created at 125 MHz.

In FIG. 5B, however, the information communication clock signals for the two transmitters are out of phase by 180 degrees, in accordance with an exemplary embodiment of the present invention. Graph (1) of FIG. 5B illustrates the current waveform of $I_{CT1}$, with an amplitude of $I_o$ and a period of 8 nanoseconds, corresponding to a frequency of 125 MHz. Graph (2) of FIG. 5B illustrates the current waveform of $I_{CT2}$, with an amplitude of $I_o$ and a period of 8 nanoseconds, corresponding to a frequency of 125 MHz. However, as the information communication clock signals used for the two transmitters are 180 degrees out of phase, $I_{CT1}$ is also 180 degrees out of phase with $I_{CT2}$. As the waveforms of $I_{CT1}$ and $I_{CT2}$ are out of phase by 180 degrees, the addition of the individual waveforms can result in a combined waveform $I_{CT1}+I_{CT2}$ that is twice frequency (e.g., 250 MHz or a period of four nanoseconds) of either $I_{CT1}$ and $I_{CT2}$, as shown in Graph (3) of FIG. 5B, and half the amplitude of the combined waveform illustrated in Graph (3) of FIG. 5A. Graph (4) of FIG. 5B illustrates the frequency spectrum of the combined waveform $I_{CT1}+I_{CT2}$. As the resulting generated signals of $I_{CT1}$ and $I_{CT2}$ are out of phase by 180 degrees, an EMI frequency component can be created at 250 MHz, twice the frequency of the EMI frequency component in Graph (4) of FIG. 5A. Additionally, the EMI frequency component at 250 MHz is half the amplitude of the frequency component of Graph (4) of FIG. 5A. Thus, exemplary embodiments of the present invention can reduce EMI by creating a EMI frequency component that is of lower amplitude and higher frequency when the information communication clock signals are staggered in phase relative to each other.

FIG. 6 is a flowchart illustrating steps for controlling phase of clock signals among a plurality of information communication devices of an information communication system, in accordance with an exemplary embodiment of the present invention. In step 605, a common reference clock signal is generated. In step 610, the common reference clock signal is received in each of the plurality of information communication devices. In step 615, an information communication clock signal is generated in each of the plurality of information communication devices. According to exemplary embodiments, each information communication clock signal of each of the plurality of information communication devices is associated with the common reference clock signal. In step 620, the phase of each information communication clock signal for each of the plurality of information communication devices is altered by a predetermined amount. According to an alternative exemplary embodiment, the phase of at least two of the information communication clock signals can be substantially identical. However, the number of information communication clock signals with substantially identical phase can be less than the total number of information communication clock signals of the information communication system. The method can be compliant with any suitable communication standard, such as, for example, I.E.E.E. 802.3ab.

Figure 7:
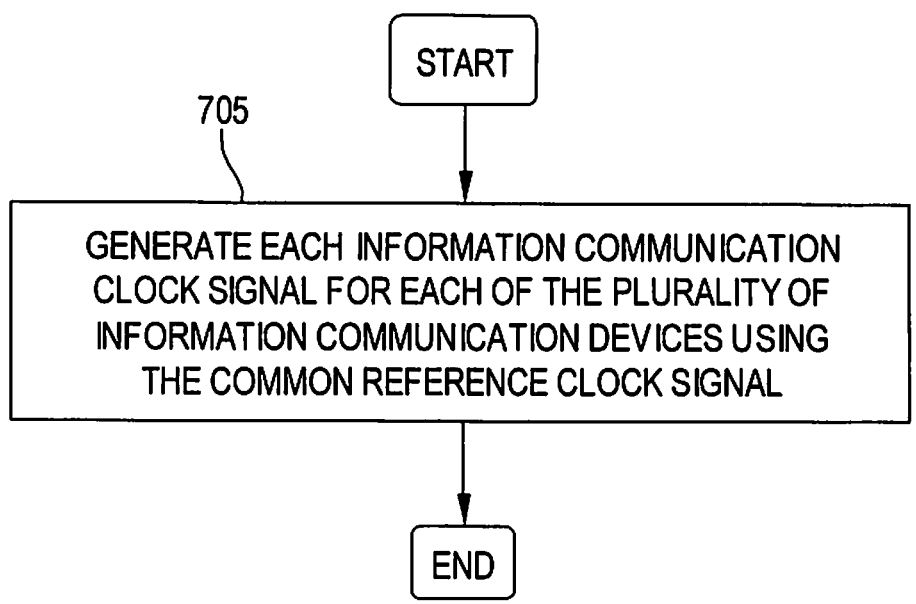
FIG. 7 is a flowchart illustrating steps for generating information communication clock signals, in accordance with an exemplary embodiment of the present invention.

FIG. 7 is a flowchart illustrating steps for step 610 of FIG. 6 of generating information communication clock signals, in accordance with an exemplary embodiment of the present invention. In step 705, each information communication clock signal for each of the plurality of information communication devices is generated using the common reference clock signal.

Figure 8:
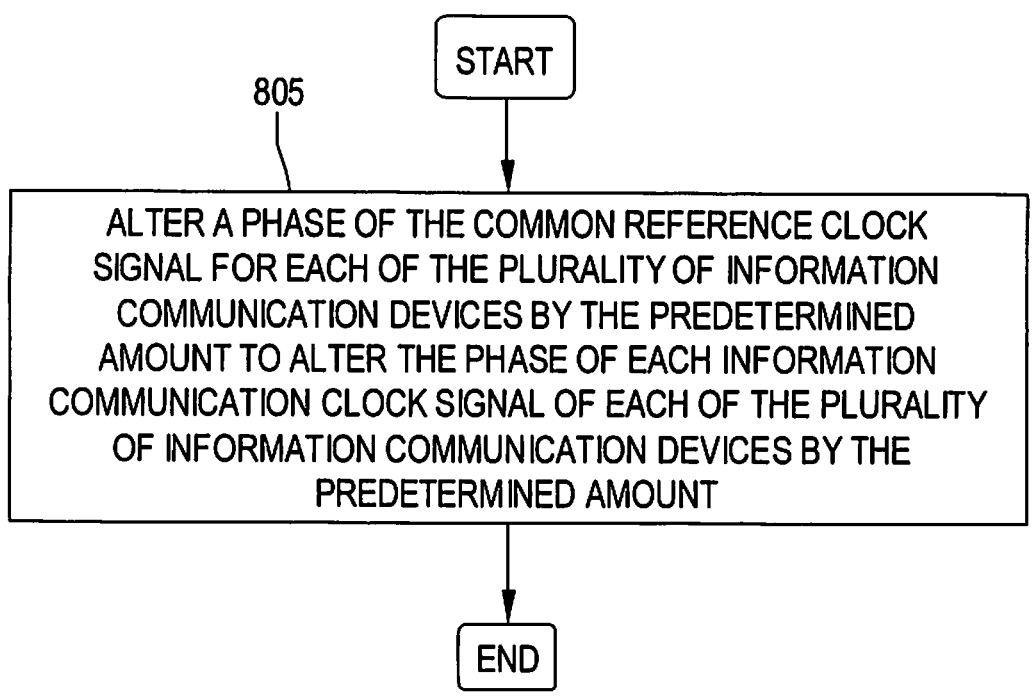
FIG. 8 is a flowchart illustrating steps for altering a phase of a common reference clock signal, in accordance with an exemplary embodiment of the present invention.
Figure 9:
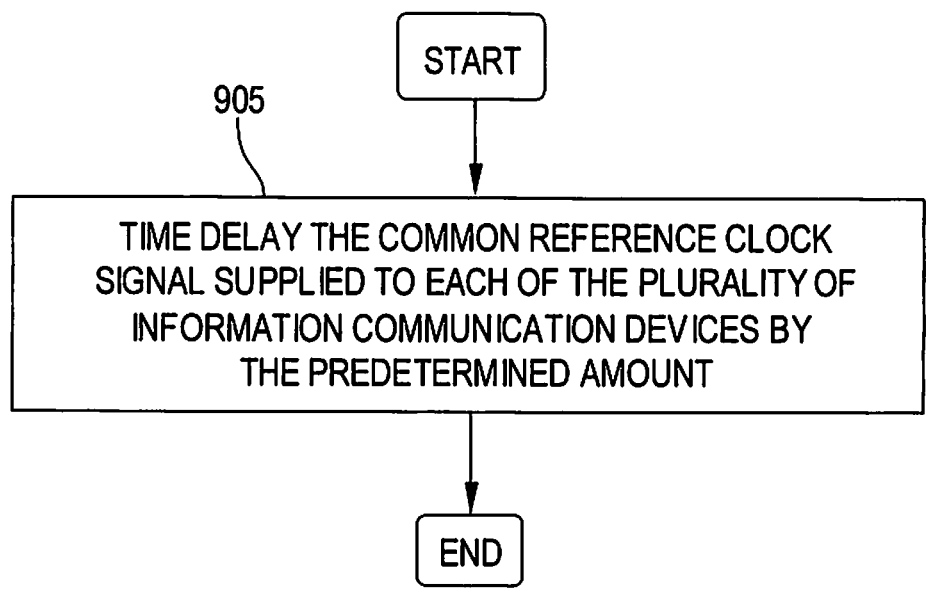
FIG. 9 is a flowchart illustrating steps for altering a phase of a common reference clock signal, in accordance with an exemplary embodiment of the present invention.

FIG. 8 is a flowchart illustrating steps for step 620 of FIG. 6 of altering a phase of a common reference clock signal, in accordance with an exemplary embodiment of the present invention. In step 805, the phase of the common reference clock signal for each of the plurality of information communication devices is altered by the predetermined amount to alter the phase of each information communication clock signal of each of the plurality of information communication devices by the predetermined amount. FIG. 9 is a flowchart illustrating steps for step 805 of FIG. 8 of altering a phase of a common reference clock signal, in accordance with an exemplary embodiment of the present invention. In step 905, the common reference clock signal supplied to each of the plurality of information communication devices is time delayed by the predetermined amount.

Figure 10:
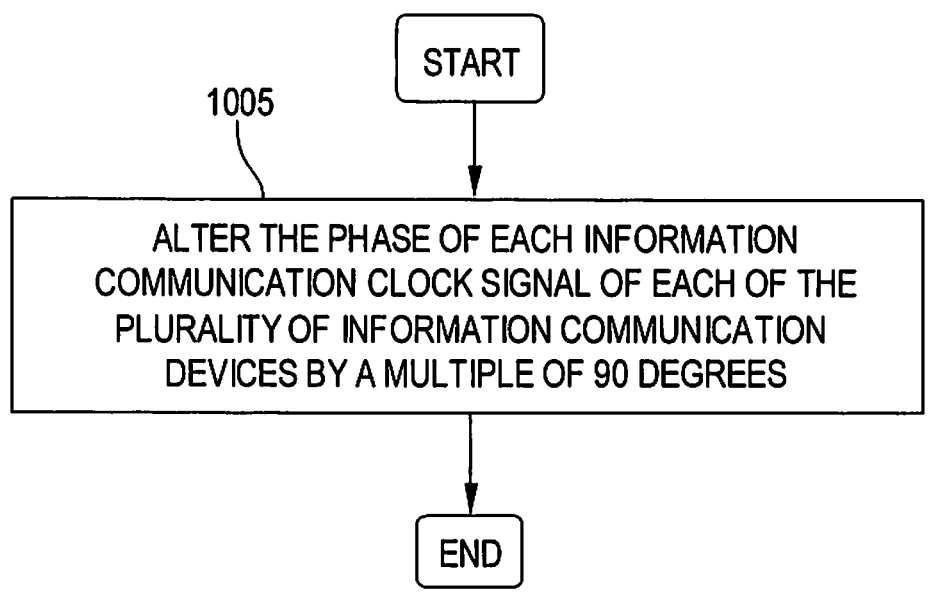
FIG. 10 is a flowchart illustrating steps for altering a phase of a common reference clock signal, in accordance with an alternative exemplary embodiment of the present invention.

FIG. 10 is a flowchart illustrating steps for step 620 of FIG. 6 of altering a phase of a common reference clock signal, in accordance with an alternative exemplary embodiment of the present invention. In step 1005, the phase of each information communication clock signal of each of the plurality of information communication devices is altered by a multiple of 90 degrees. However, the phase of each information communication clock signal can be altered by any appropriate amount relative to the other information communication clock signals.

Figure 11:
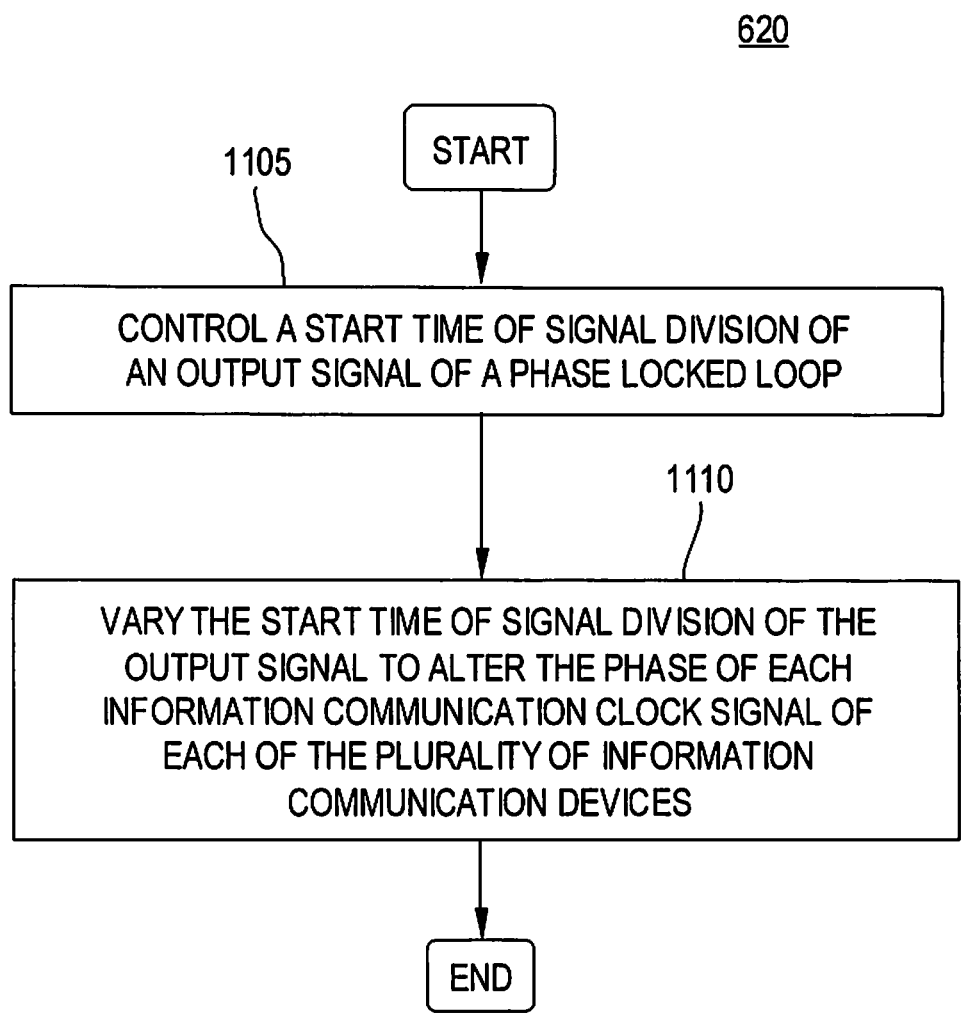
FIG. 11 is a flowchart illustrating steps for altering a phase of a common reference clock signal, in accordance with an alternative exemplary embodiment of the present invention.

FIG. 11 is a flowchart illustrating steps for step 620 of FIG. 6 of altering a phase of a common reference clock signal, in accordance with an alternative exemplary embodiment of the present invention. In step 1105, the start time of signal division of an output signal of a phase locked loop is controlled. According to exemplary embodiments, the output signal can be associated with the information communication clock signal. In step 1110, the start time of signal division of the output signal is varied to alter the phase of each information communication clock signal of each of the plurality of information communication devices.

Figure 12:
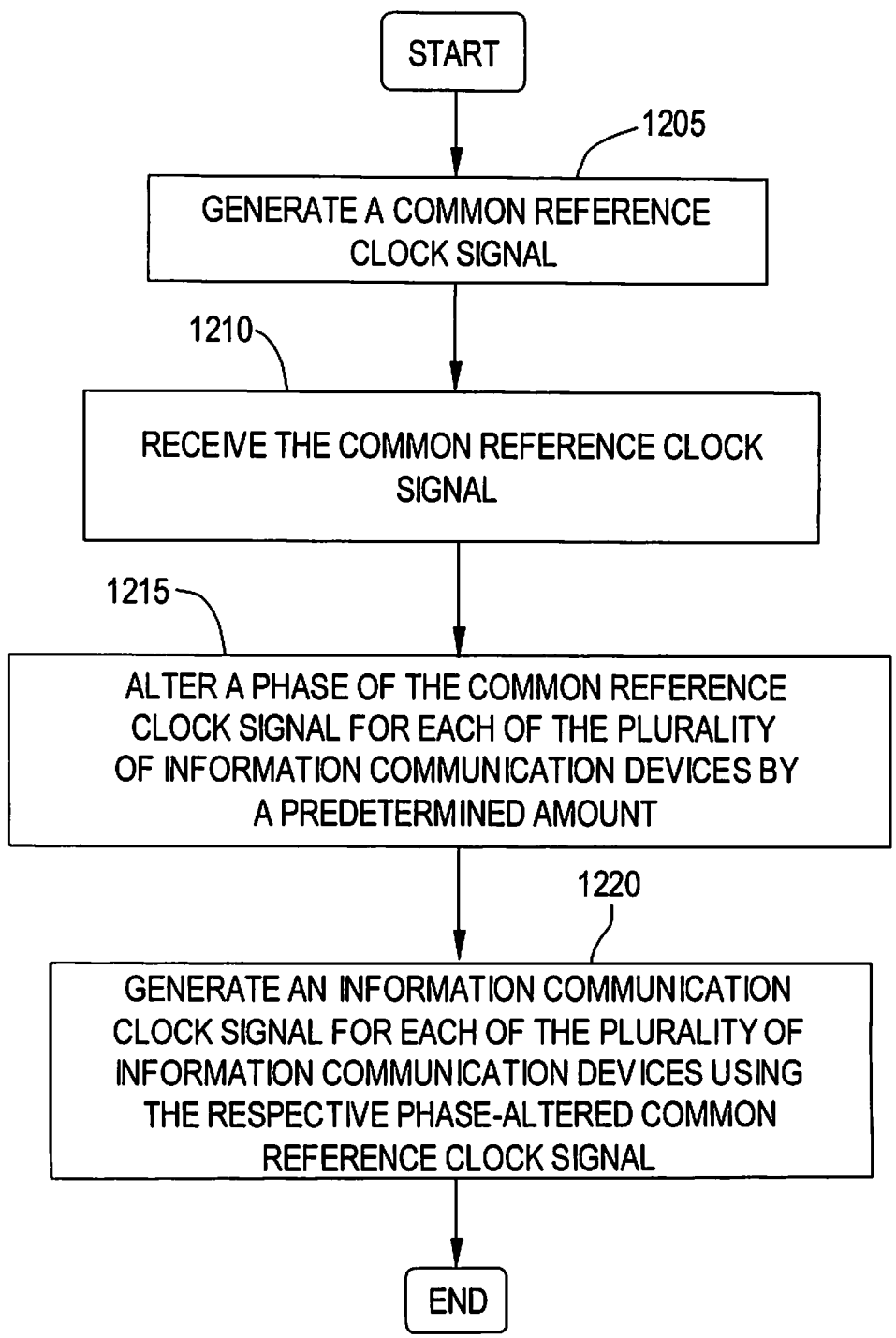
FIG. 12 is a flowchart illustrating steps for controlling phase of clock signals among a plurality of information communication devices of an information communication system, in accordance with an alternative exemplary embodiment of the present invention.

FIG. 12 is a flowchart illustrating steps for controlling phase of clock signals among a plurality of information communication devices of an information communication system, in accordance with an alternative exemplary embodiment of the present invention. In step 1205, a common reference clock signal is generated. In step 1210, the common reference clock signal is received. According to exemplary embodiments, each of the plurality of information communication devices is responsive to the common reference clock signal. In step 1215, the phase of the common reference clock signal for each of the plurality of information communication devices is altered by a predetermined amount. In step 1220, an information communication clock signal is generated for each of the plurality of information communication devices using the respective phase-altered common reference clock signal. Consequently, the phase of each information communication clock signal of each of the plurality of information communication devices is altered by the predetermined amount. According to an alternative exemplary embodiment, the phase of at least two of the information communication signals can be substantially identical. However, the number of information communication clock signals with substantially identical phase can be less than the total number of information communication clock signals of the information communication system. The method can be compliant with any suitable communication standard, such as, for example, I.E.E.E. 802.3ab.

Figure 13:
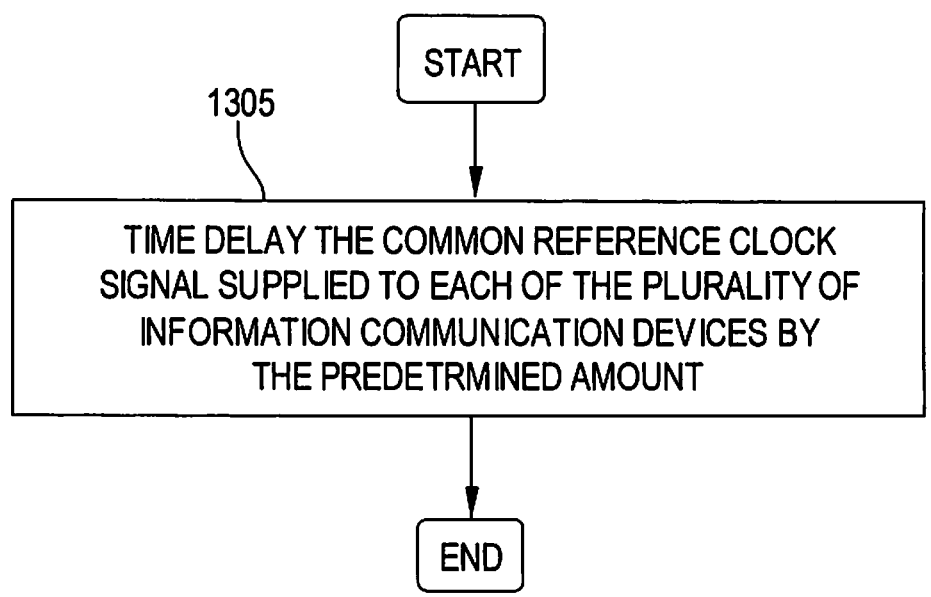
FIG. 13 is a flowchart illustrating steps for altering a phase of a common reference clock signal, in accordance with an exemplary embodiment of the present invention.
Figure 14:
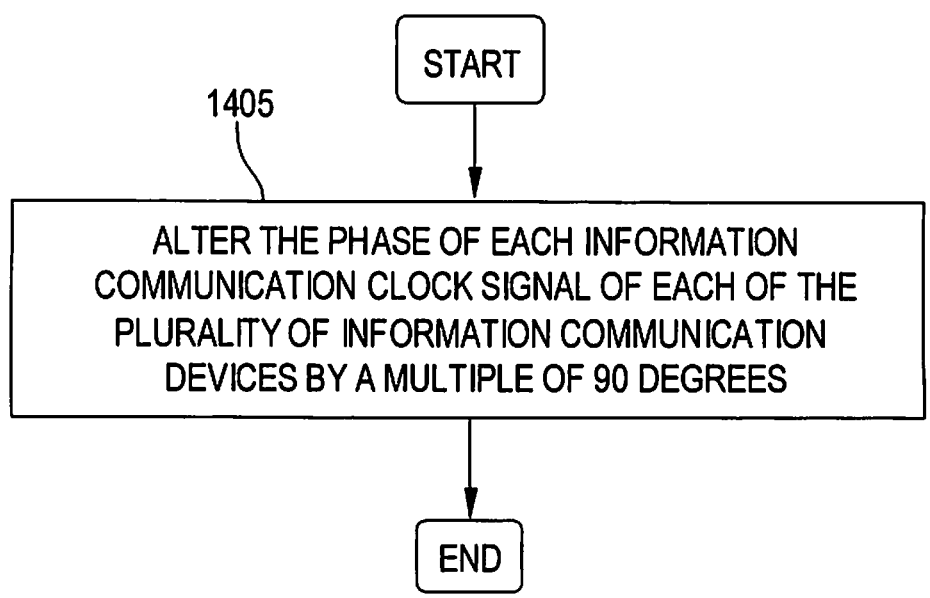
FIG. 14 is a flowchart illustrating steps for altering a phase of a common reference clock signal, in accordance with an alternative exemplary embodiment of the present invention.

FIG. 13 is a flowchart illustrating steps for step 1215 of FIG. 12 of altering a phase of a common reference clock signal, in accordance with an exemplary embodiment of the present invention. In step 1305, the common reference clock signal supplied to each of the plurality of information communication devices is time delayed by the predetermined amount. FIG. 14 is a flowchart illustrating steps for step 1215 of FIG. 12 altering a phase of a common reference clock signal, in accordance with an alternative exemplary embodiment of the present invention. In step 1405, the phase of each information communication clock signal of each of the plurality of information communication devices is altered by a multiple of 90 degrees. However, the phase of each information communication clock signal can be altered by any appropriate amount relative to the other information communication clock signals.

Any or all of the steps of a computer program as illustrated in FIGS. 6-14 for controlling phase of clock signals among a plurality of information communication devices of an information communication system can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Exemplary embodiments of the present invention can be used in any device or system that communicates information, including both wired and wireless communication systems, particularly in systems and devices where multiple channels of information can be communicated simultaneously and the information communication clock signals used to communicate that information are derived from a common reference clock signal.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A communication system comprising:
a phase-locked loop configured to generate an output signal in response to a common reference clock signal, wherein the output signal is in phase lock with the common reference clock signal;
a signal division controller configured to
receive a select signal,
select an edge of a rising edge of the output signal and a falling edge of the output signal in response to the select signal, and
generate a divider reset signal in response to the selected edge;
a divider configured to generate a communication clock signal by performing frequency division of the output signal, wherein the divider reset signal controls a start time of the frequency division; and
a transmitter configured to operate in response to the communication clock signal.

2. The communication system of claim 1, further comprising a reference clock signal generator configured to generate the common reference clock signal.

3. The communication system of claim 1, further comprising:
a plurality of dividers configured to generate a plurality of communication clock signals; and
a plurality of transmitters configured to operate in response to the plurality of communication clock signals, respectively,
wherein the plurality of dividers includes the divider, the plurality of communication clock signals includes the communication clock signal, and the plurality of transmitters includes the transmitter.

4. The communication system of claim 3, wherein:
the plurality of dividers is configured to generate the plurality of communication clock signals by performing frequency division of the output signal according to a plurality of divider reset signals, respectively; and
the plurality of divider reset signals includes the divider reset signal.

5. The communication system of claim 3, wherein:
the plurality of communication clock signals are generated so that phases of a first number of the plurality of communication clock signals are substantially identical; and
the first number is less than a total number of the plurality of communication clock signals.

6. The communication system of claim 3, wherein the plurality of dividers is configured to generate the plurality of communication clock signals to each have a predetermined phase offset from another of the plurality of communication clock signals.

7. The communication system of claim 6, wherein the predetermined phase offset is based on three hundred sixty degrees divided by a total number of the plurality of communication clock signals.

8. The communication system of claim 1, further comprising an Ethernet transceiver that includes the transmitter.

9. The communication system of claim 1, wherein:
the divider is configured to divide a frequency of the output signal by an integer; and
the integer is based on a number of possible values of the select signal.

10. The communication system of claim 9, wherein the number of possible values of the select signal is equal to a total number of a plurality of transmitters, wherein the plurality of transmitters includes the transmitter.

11. The communication system of claim 1, wherein the signal division controller is configured to generate the divider reset signal further in response to a system reset signal.

12. The communication system of claim 1, wherein the select signal includes a plurality of bits, and wherein the select signal selects one of a plurality of phases for the communication clock signal.

13. A method of operating a communication system, the method comprising:
- generating an output signal in response to a common reference clock signal using a phase-locked loop, wherein the output signal is in phase lock with the common reference clock signal;
- receiving a select signal;
- selecting an edge of a rising edge of the output signal and a falling edge of the output signal in response to the select signal;
- generating a divider reset signal in response to the selected edge;
- generating a communication clock signal by performing, at a start time, frequency division of the output signal, wherein the divider reset signal controls the start time of the frequency division; and
- operating a transmitter of the communication system in response to the communication clock signal.

14. The method of claim 13, further comprising:
- generating a plurality of communication clock signals; and
- operating a plurality of transmitters of the communication system in response to the plurality of communication clock signals, respectively,
- wherein the plurality of communication clock signals includes the communication clock signal, and
- wherein the plurality of transmitters includes the transmitter.

15. The method of claim 14, wherein the generating the plurality of communication clock signals includes performing frequency division of the output signal according to a plurality of divider reset signals, respectively, wherein the plurality of divider reset signals includes the divider reset signal.

16. The method of claim 14, wherein the generating the plurality of communication clock signals is performed so that phases of a first number of the plurality of communication clock signals are substantially identical, wherein the first number is less than a total number of the plurality of communication clock signals.

17. The method of claim 14, wherein the generating the plurality of communication clock signals is performed so that the plurality of communication clock signals each have a predetermined phase offset from another of the plurality of communication clock signals, wherein the predetermined phase offset is based on three hundred sixty degrees divided by a total number of the plurality of communication clock signals.

18. The method of claim 13, wherein the generating the communication clock signal includes dividing a frequency of the output signal by an integer, wherein the integer is based on a number of possible values of the select signal.

19. The method of claim 13, wherein the generating the divider reset signal is performed further in response to a system reset signal.

20. The method of claim 13, wherein the select signal includes a plurality of bits, and wherein the select signal selects one of a plurality of phases for the communication clock signal.

* * * * *